United States Patent
Blohowiak et al.

[11] Patent Number: 6,046,139
[45] Date of Patent: Apr. 4, 2000

[54] MAKING LARGE, SINGLE CRYSTAL, 123 YBCO SUPERCONDUCTORS

[75] Inventors: Kay Y. Blohowiak; Darryl F. Garrigus, both of Issaquah; Thomas S. Luhman, Bellevue; Kevin E. McCrary, Port Orchard; Michael Strasik, Issaquah, all of Wash.; Ilhan Aksay, Princeton, N.J.; Fatih Dogan, Seattle, Wash.; William C. Hicks, Olympia, Wash.; Corrie B. Martin, Seattle, Wash.

[73] Assignee: The Boeing Company, Seattle, Wash.

[21] Appl. No.: 09/130,780

[22] Filed: Aug. 7, 1998

Related U.S. Application Data

[60] Provisional application No. 60/055,154, Aug. 8, 1997.

[51] Int. Cl.$^7$ .................................................. C04B 35/653
[52] U.S. Cl. ........................ 505/450; 505/451; 505/490; 505/729
[58] Field of Search ..................... 505/450, 451, 505/490, 500, 729, 742; 117/41, 74, 208

[56] References Cited

U.S. PATENT DOCUMENTS

| | | | |
|---|---|---|---|
| 5,061,682 | 10/1991 | Aksay et al. | 505/1 |
| 5,126,317 | 6/1992 | Agarwala | 505/1 |
| 5,395,820 | 3/1995 | Murakami et al. | 505/126 |
| 5,648,319 | 7/1997 | Morita et al. | 505/230 |
| 5,776,864 | 7/1998 | Todt et al. | 505/450 |
| 5,869,432 | 2/1999 | Aksay et al. | 505/450 |

OTHER PUBLICATIONS

Ohtsu, K. et al., "Crystal Growth of Bulk YBCO Superconducting Oxides; Effect of Undercooling," Adv. Superconductivity V (1993), pp. 581–583.

Endo, A. et al., "Relationship Between Groth Rate and Undercooling in Pt–added $Y_1Ba_2Cu_3O_{7-x}$." J. Mater. Res., vol. 11, No. 5, May 1996, pp. 1114–1119.

Armstrong, et al., "Texture Development in High–Temperature Superconductors," Allied–Signal preprint (undated).

Blohowiak, et al.,"Evaluation of $YBa_2Cu_3O_7$ Bulk Superconductors for High Field Magnet Applications," IEEE Trans. Appl. Superconductivity, 3 [1] 1049–52,1993.

Gotor, et al.,"Grain growth, sintering and weak links in YBCO ceramics: advantage of sol–gel process," Physica C 235–240, 463–4, 1995.

Hor, et al., "High–Pressure Study of the New Y–Ba–Cu–O Superconducting Compound System," Phys.Rev. Letters, vol. 58 [9], 911–2, 1987.

Izumi, et al., "Reaction mechanism of Y–system superconductors in the MPMG method," J. Mater. Res, 7[4] 801–7, 1992.

(List continued on next page.)

*Primary Examiner*—Mark Kopec
*Attorney, Agent, or Firm*—John C. Hammar

[57] ABSTRACT

We make large (in excess of 2 cm in diameter), single crystal $YBa_2Cu_3O_{7-x}$[123 YBCO] crystals, where $x \leq 0.6$, in a seventeen step process or some variant thereof from finely ground and well mixed 123 YBCO and 211 YBCO powders with a small amount of Pt by controlling the rate of cooling from within a compact of the powders using a temperature gradient in the radial and axial planes (independently) of about 1–1° C./inch diameter of compact to nucleate the crystal growth. We promote crystal growth as well using a samarium oxide seed crystal, preferably $SmBa_2Cu_3O_{(7-y)}$, where $y \leq 1.6$. After nucleation we cool the compact slowly at a rate from about 0.1–1° C./hr to promote the single crystal development.

10 Claims, 4 Drawing Sheets

OTHER PUBLICATIONS

Kimura, et al., Critical Current Density of Melt(QMG)–Processed $Yba_2Cu_3O_x$ Bulk Superconductors, Inst. For Mat'ls Res. (1900$^{th}$), 190–6, 1992.

Morita, et al., "Magnets Made of QMG Crystals," Adv. Mat'ls & Tech. Res. Lab., Nippon Steel Corp. (undated).

Murakami, "Flux Pinning of Melt Processed YBCO Superconductors and Their Applications," to appear in Studies of High Temperature Superconductors (Narlikar, ed.), Nova Sci. Publ., vol. 9 (undated).

Murakami, "Melt Processing of YBaCuO Superconductors and Critical Currents," Mod. Phys. Letters B, 4 [3] 163–79, 1990.

Sasaki, et al., "Magnetic Shielding by Superconducting Y–Ba–Cu–O Prepared by the Modified Quench and Melt Growth (QMG) Process," Jpn. J.Appl. Phys., 31 [Part 1, No.4] 1026–32, 1992.

Sawano, et al., "High Magnetic Flux Trapping by Melt–Growth YBaCuO Superconductors," Jpn. J. Appl. Phys., 30 [7A], 1157–59, 1991.

MAKING LARGE, SINGLE CRYSTAL, 123 YBCO SUPERCONDUCTORS

REFERENCE TO RELATED APPLICATION

The present application claims the benefit of U.S. Provisional Patent Application No. 60/055,154, filed Aug. 8, 1997.

NOTICE OF GOVERNMENT RIGHTS

This invention was made with Government support under a contract awarded by DARPA. The Government has certain rights in this invention.

TECHNICAL FIELD

The present invention relates to method of growing large, single crystal, superconducting $YBa_2Cu_3O_{7-x}$ crystals (123 YBCO) and to the crystals so produced. More particularly, the invention relates to sintering fine powders of $YBa_2Cu_3O_{7-x}$ precursors, where $x \leq 0.6$, for controlled times at suitable temperatures in a thermal gradient controlled independently for the radial crystal growth and axial crystal growth to produce superconducting 123 YBCO single crystals several centimeters in diameter (typically 2–8 cm; about 1–3 inches).

BACKGROUND OF THE INVENTION

Superconductors based on the $YBa_2Cu_3O_{7-x}$ system [123 YBCO], where $x \leq 0.6$, have been known since IBM researchers discovered them in 1986. They are called "high temperature" superconductors because they are superconducting at temperatures well above absolute zero, e.g., at liquid nitrogen temperature (77° K) and higher.

$YBa_2Cu_3O_{7-x}$ crystals can trap magnetic fields, but the flux density is largely dependent on the grain size and the microstructure. The largest trapped magnetic fields require large grain, single crystal specimens, but growing $YBa_2Cu_3O_{7-x}$ crystals larger than 0.5 cm in diameter is difficult. It is especially difficult to make crystals that can achieve a current density ($J_c$) exceeding $10^3$ A/cm$^2$ in a magnetic field of 1 Tesla or higher at 77° K. Conventionally made $YBa_2Cu_3O_{7-x}$ superconductors tend to exhibit rapid loss of $J_c$ when subjected to magnetic fields of increasing strength.

Several researchers have attempted to increase crystal and grain sizes and improve $J_c$ by a quench-melt-grow method (*Mat'l Res.*, Vol. 7, No. 4, April 1992, pp. 801–807) or by directional solidification (*Cryogenics*, Vol. 30, January 1990, pp. 5–10). These prior art methods have not achieved a crystal with sufficient magnetic flux trapping ability and current density capacity for practical application in such devices as low loss magnetic bearings, high strength magnetic clamps, or high gain electromagnetic antennas.

SUMMARY OF THE INVENTION

A large, single crystal 123 YBCO material that is practical for these applications can be made using the method of the present invention. This crystal iis superconducting at temperatures at or below about 77° K is made by mixing powders comprising from about 1 to 25 weight percent (1–25 wt %) $Y_2BaCuO_5$, [211 YBCO] from about 0.05–1.0 wt % platinum, and the balance $YBa_2Cu_3O_{7-x}$, [123 YBCO] where $x \leq 0.6$. The powders have an average particle size of about 5 micrometers or less, and are preferably pressed into a compact having a substantially right circular cylindrical shape.

We place a seed crystal of $SmBa_2Cu_3O_{7-y}$, [123 SBCO] where y=1.6, in a base plane slab or slice at the center of the top or bottom circular surface of the compact. The seed crystal is oriented so that the desired seed crystal plane is substantially parallel to the compact's top or bottom surface. The compact and seed crystal are placed on a setter which prevents leaching of the liquid phase during sintering. The compact is then heated to a sintering temperature between about 1010–1050° C. and held at that temperature for a time sufficient to fuse the seed crystal to the compact surface, generally at least about 0.1 hour. Then the temperature is lowered at a rate of from about 1–10° C. per hour. $YBa_2Cu_3O_{7-x}$ [123 YBCO] crystal growth nucleates from the $SmBa_2Cu_3O_{7-x}$ [123 SBCO] seed crystal as the crystal cools. After nucleation, the compact is cooled at a rate of from about 0.1–1.0° C. per hour to a temperature of about 950° C. 123 YBCO crystal growth radiates from the nucleation site until the entire compact consists essentially of single crystal, single grain $YBa_2Cu_3O_{7-x}$ body. The compact may then be cooled more quickly to room temperature. The sintered compact is annealed at a temperature in the range from about 400–600° C. in an oxygen atmosphere for at least about 10 hours.

The present invention, therefore, relates to a method for making a large, single crystal 123 YBCO superconductor using a samarium oxide seed crystal to promote growth in a compact of 123 YBCO precursor powders and an effective amount of Pt.

A preferred feature of the present invention also relates to a method for making a large, single crystal 123 YBCO superconductor by, first, creating independent temperature gradients radially and axially in a compact of 123 YBCO precursor powder, 211 YBCO precursor powder, and an effective amount of Pt. The gradients are each generally about 1–20° C./inch of compact. Cooling the compact further while maintaining the temperature gradient at a rate of cooling sufficient to nucleate single crystal growth in the compact produce the desired large crystal.

We control the microstructure in these single crystals to achieve substantially uniform, large critical current densities that provide excellent superconducting performance in large magnetic fields. We have made crystals up to 3 inches in diameter and crystals with critical current densities over $10^4$ A/cm$^2$ in magnetic fields of 2–8 Tesla or more at 77° K.

DETAILED DESCRIPTION

In accordance with a preferred embodiment of the present invention, a large, substantially single crystal of superconducting $YBa_2Cu_3O_{7-x}$, where $x \leq 0.6$, [123 YBCO] is made by combining micron size particles comprising from about 1–25 wt % $Y_2BaCuO_5$ (211 YBCO) with about 0.05–1.0 wt % platinum (Pt), and the balance $YBa_2Cu_3O_{7-x}$ in an organic solvent, such as hexane or acetone, to form a thin slurry. The 211 YBCO provides flux pinning centers throughout the single crystal while the Pt, we believe, limits the growth of the 211 YBCO particles and limits the loss of liquid from the melt during crystal growth. The slurry mix is attrited in a ball mill for a time sufficient to provide thorough mixing of the several constituents, generally for several hours. The slurry is cooled sufficiently, if necessary, to prevent evaporation of the solvent. After attriting, the powder is sieved from the slurry and passed through an air driven jet mill. The milled powder is either processed immediately or stored in an inert atmosphere until needed. The average particle size is less than 5 micrometers.

To process the powder into a superconducting body, it is pressed into a green compact disk in a standard press at 2,000–10,000 psi, and then further condensed by cold, isostatic compaction at 15,000–45,000 psi or higher. The preferred compact shape is cylindrical to promote single crystal growth, however, other desired shapes may be formed by adapting the sintering cycle described below.

Figure 1:
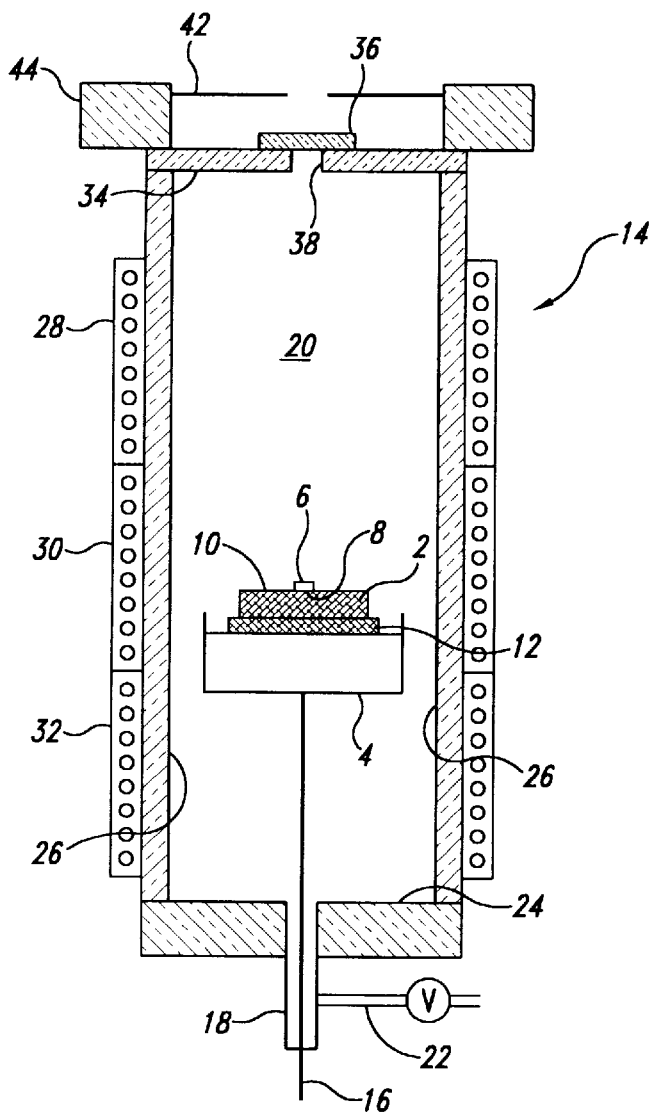
FIG. 1 is a sectional view of a furnace suitable for processing superconducting $YBa_2Cu_3O_{7-x}$ bodies in accordance with the invention.
Figure 2:
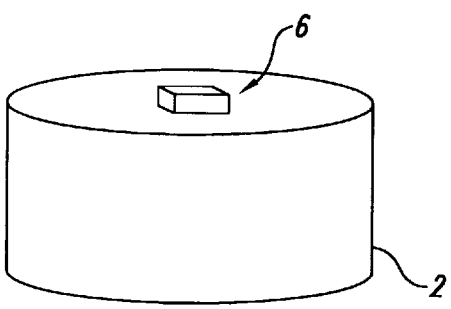
FIG. 2 is a perspective view of a powder compact and a seed crystal on the surface of a compact of 123 YBCO precursor powders prior to sintering showing grain growth directions from the seed crystal.
Figure 3:
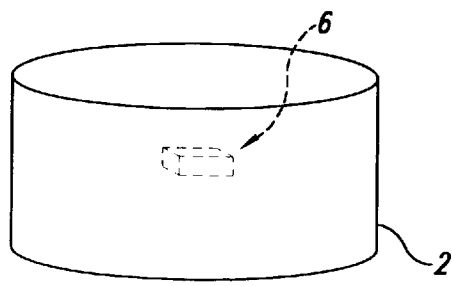
FIG. 3 is another perspective view, similar to FIG. 2, showing a seed crystal embedded into the center of the compact.
Figure 4:
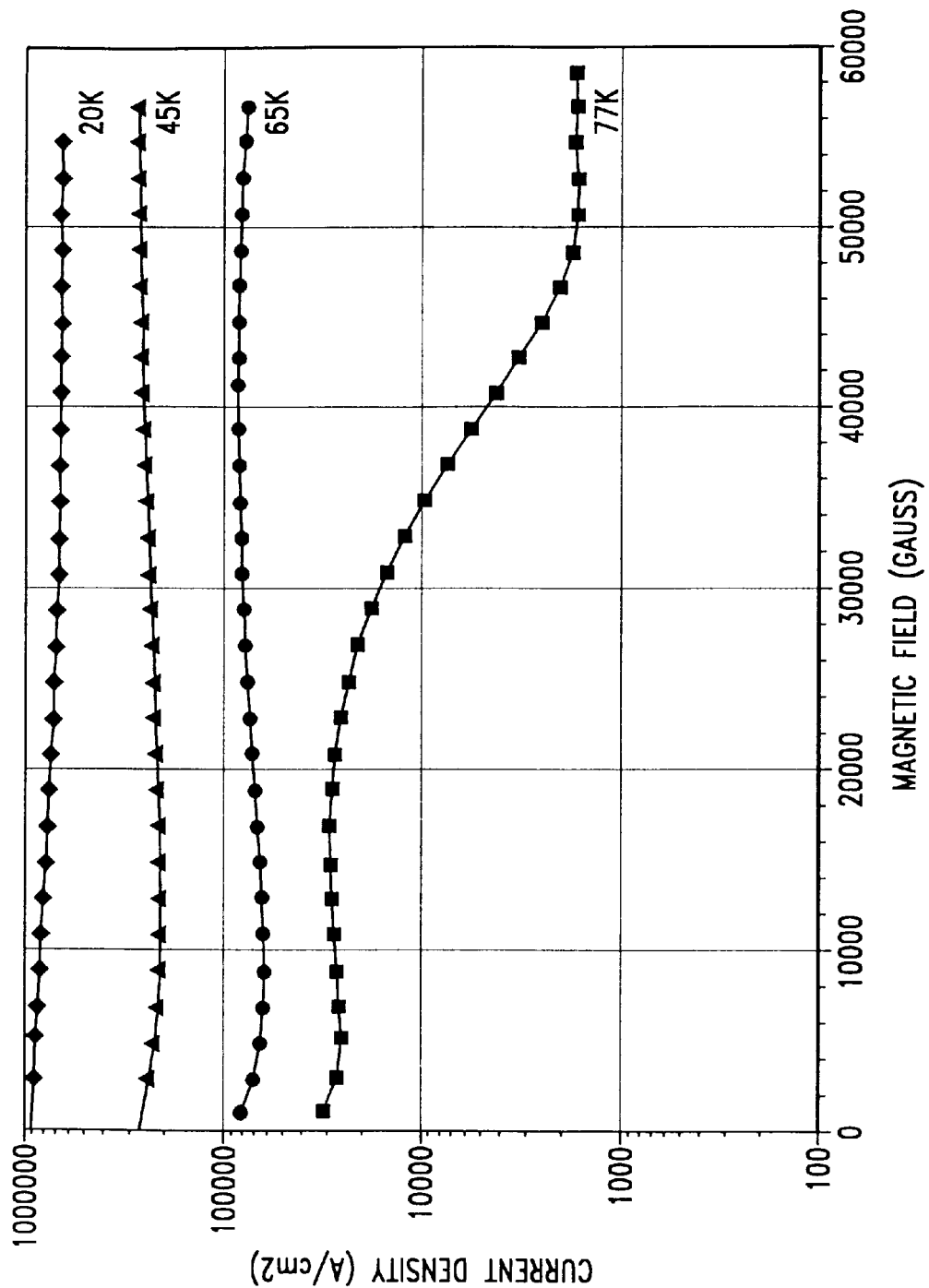
FIG. 4 is a graph that illustrates the current densities at different magnetic field strengths we have achieved with two inch diameter single crystal 123 YBCO materials of the present invention.
Figure 5:
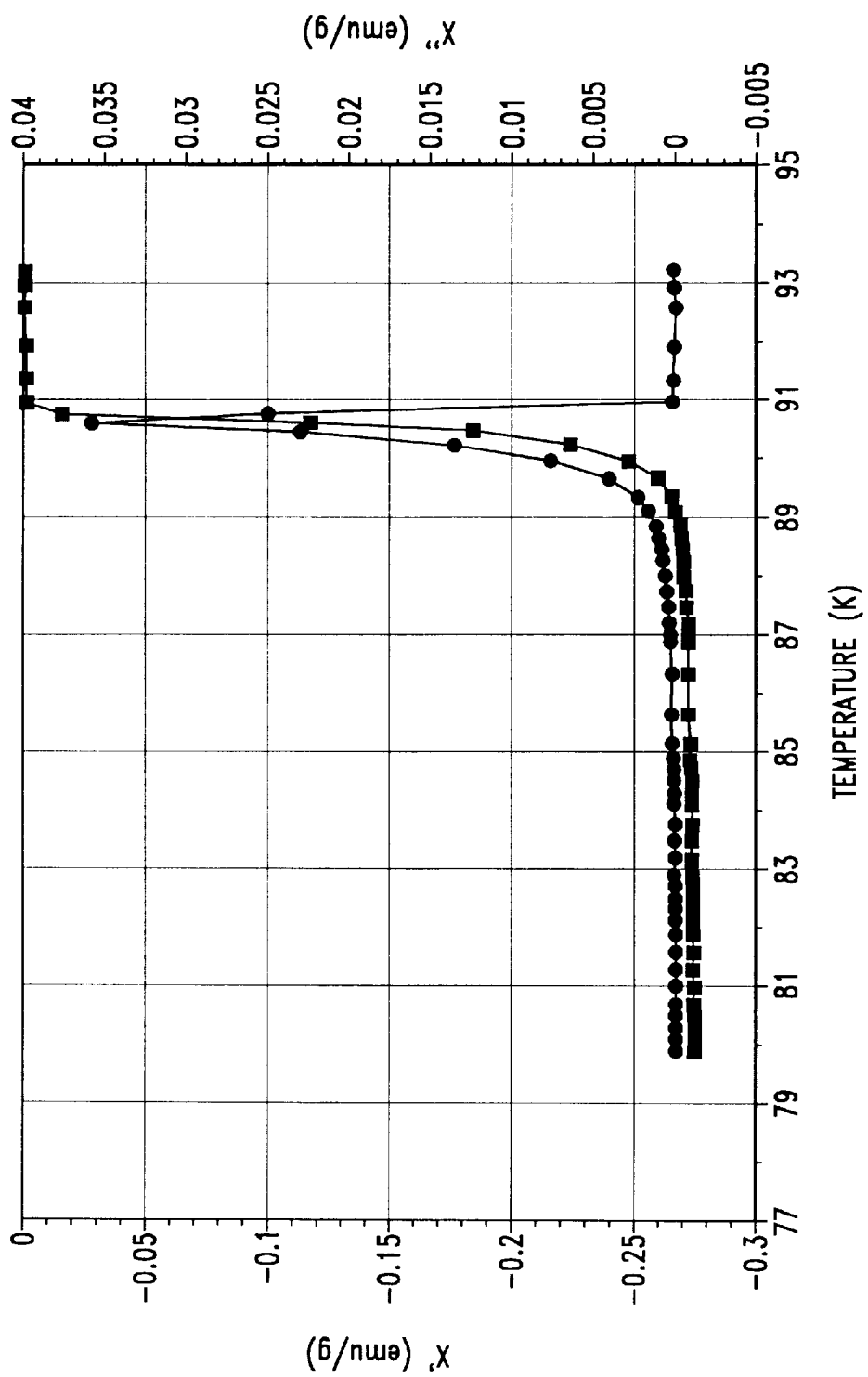
FIG. 5 is a graph that illustrates the AC susceptibility as a function of temperature for 123 YBCO single crystals of the present invention.
Figure 6:
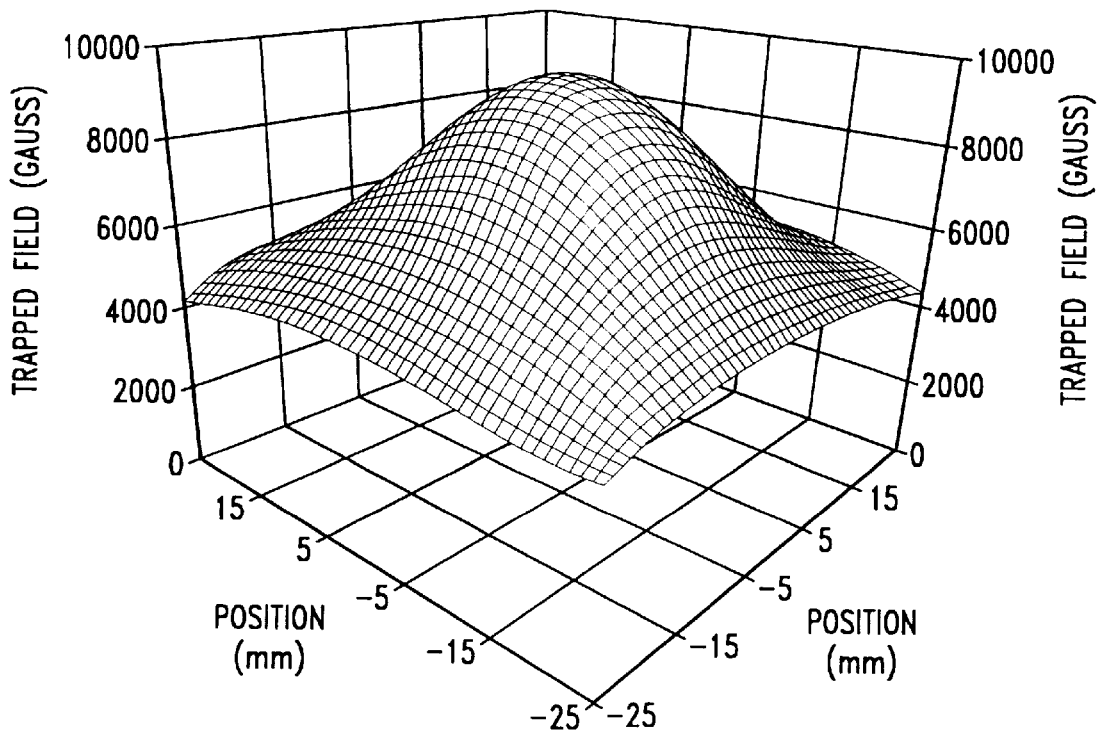
FIG. 6 is another graph that illustrates the trapped field profile for our two inch diameter 123 YBCO materials at 77° K.

Referring to FIG. 1, the compact 2 is placed on a setter 4 prior to sintering. Seed crystal 6 of a suitable material such as $SmBa_2Cu_3O_{7-x}$, where $x=1.6$, is placed generally at the center 8 of top circular surface 10. The seed crystal 6 is oriented so that the desired crystal plane, preferably the A-B plane of a $SmBa_2Cu_3O_{7-x}$ crystal, is in contact with and substantially parallel to the compact's top surface 10. If desired, such a seed crystal may be pressed into the compact during powder consolidation anywhere along a central axis of the compact.

The setter 4 is preferably lined with a layer 12 of a sintered $YBa_2Cu_3O_{7-x}$ gravel which is relatively rich in platinum. The setter 4 is preferably low mass so that it does not cause substantial conductive heating to the compact 2. Layer 12 is adapted to prevent crystallization of the compact 2 and to prevent leaching of liquid phases during sintering.

The setter 4 is supported in the furnace 14 with a ceramic rod 16. The rod may be made of silica or other refractory material which does not interfere with sintering of the compact 2. The rod 16 may be moved up and down in the furnace 16 through asealed outlet 18. A controlled draft of filtered air is provided to the sintering chamber 20 within the furnace 14 through port 22. The floor 24 and walls 26 of the furnace 14 are also made of a suitable refractory material such as mullite. Sets of heating coils 28, 30, and 32 surround the walls 26 and are heated separately and independently to create desired temperature gradients within the sintering chamber 20. Top 34 and top cap 36 of the furnace are preferably made from fused, transparent silica to form an observation window that is resistant to the furnace temperature yet allowing viewing of the compact 2 during heating. Top 34 has a central opening or port 38. The cap 36 can be moved with respect to the port 38 to control gas flow from the sintering chamber 20. An iris shutter 42 in retaining ring 44 is thermally reflective and can be opened and closed to further modulate temperature in the chamber 20.

The following examples describe our preferred methods for making large 123 YBCO single crystals:

EXAMPLE 1

(a) Powder Process

Mix 85 mol % 123 YBCO, 15 mol % 211 YBCO, and 0.5 wt. % platinum Standard process batch size:

1500 g 123 YBCO 185 g 211 YBCO 8.425 g platinum

These powdered materials are mixed in a large excess of hexane in a large beaker using an industrial stirring blade to create a thin slurry. Mixing time is about 1 hour. The resulting slurry is poured into a large capacity attritor (ball mill) while the mill is turning at about 120 rpm. The grinding media in the mill generally is silicon nitride coated with Y, Ba, Cu oxide. The materials are ground/mixed (i.e., "attrited" for 6 hours, and the resulting slurry is poured into trays to remove the hexane. The silicon nitride grinding media is removed, and the dry powder is sieved through a 75 micron sieve. The powder is then weighed and placed in appropriate containers for later use.

(b) Pressing Process

The materials are weighed and poured into the proper size die, and pressed to between 4750 and 5250 psi for a 1.2" or 1.4" diameter die, to about 3000 psi for a 2.1" die, and to about 2250 psi on a 3" or 3.5" die. The pressed pellets are pushed out of the die and are placed in a rubber isostatic pressing bag and sealed. A vacuum is then "pulled" on the inside of the bag. The bag is placed in the isostatic press, and pressed with about 20,000–25,000 psi. The sample is removed from the bag just prior to being placed in the sintering furnace.

(c) Growing Procedure black max #2 powder preparation and pressing as previously explained.

[Boeing ID# B95037]

1.4"×0.8" to start

Set up the furnace from bottom to top as follows:

1) 1 large alumina disc; sample support—0.5"×0.2"
2) 4 (2 stacks of 2 each) alumina spacers-offset from center 2" (that is, 2"×0.6"×0.06" (0.12" combined))
3) 1 very thin, permanent alumina plate—0.4"×0.028"
4) 1 very thin, consumable alumina plate—0.4"×0.028"
5) 1 thin disc of magnesium oxide—2.25"×0.2"
6) 1 premelted disc of 123 YBCO—1.8"×0.3"
7) 3 formed cubes of pure platinum—placed equidistant from the edge to the center of where the sample is to be placed, 120° apart—0.1"×0.1"×0.1"
8) sample (pellet) to be processed—1.275"×0.75", 70.298 g
9) samarium oxide [123 SBCO] seed crystal—0.5 mm×0.5 mm×0.25 mm atop the pellet in the proper orientation.

The sample and associated equipment are lowered into the furnace 20 to a point where the sample surface is about 22.25" from the top of the processing tube, and is centered radially. A 0.13" quartz disc is placed over the top of the process tube. The furnace temperature was controlled to heat with the following profile:

| | |
|---|---|
| 180° C./hr - 1084° C. set | hold 0.5 hours |
| 10° C./hr - 1071° C. set | no hold |
| 0.5° C./hr - 1064° C. set | no hold |

-continued

| | |
|---|---|
| 0.1° C./hr - 1053° C. set | no hold |
| 0.5° C./hr - 1025° C. set | no hold |
| 50° C./hr - 23° C. (ambient) | end |

Our laboratory furnace exhibited a nonlinear radial gradient of 10–12° C. After cooling, we removed excess material from the bottom of the sample.

(d) Test Results

Flux Trap Measurements—after 70 Hours in Oxygen

5000 Gauss applied—3960 Gauss top, 3040 Gauss bottom after 230 hours in oxygen

5000 Gauss applied—4180 Gauss top, 3370 Gauss bottom after 390 hours in oxygen

5000 Gauss applied—4075 Gauss top, 3200 Gauss bottom

10000 Gauss applied—5300 Gauss top, 4300 Gauss bottom

EXAMPLE 2

Growing Procedure

Ceramics Lindberg

Powder preparation and pressing as previously explained.

[Boeing ID# B95052]

1.4"×0.625" to start

Set up the furnace from bottom to top as follows:
1) 1 block of commercial fire brick—2"×2"
2) 1 very thin square of alumina—3"×3"×0.028"
3) 1 thin disc of magnesium oxide.—2.25"×0.2"
4) premelted disc of 123 YBCO—1.8"×0.3"
5) Small amount (enough to cover the area of the pellet to be processed) of pre-melted crushed 123 YBCO—300 to 589 microns
6) Sample (pellet) to be processed—1.275"×0.6", 56.02 g
7) Samarium oxide [123 SBCO] seed crystal atop the sample in the desired orientation—0.5 mm×0.5 mm×0.25 mm The sample and associated substrates were placed in the center of the furnace horizontally and vertically, and the furnace is then sealed. The furnace temperature was controlled to heat with the following profile:

| | |
|---|---|
| 200° C./hr - 1010° C. | set hold 0.5 hours |
| 10° C./hr - 995° C. | set no hold |
| 0.3° C./hr - 944° C. | set no hold |
| 100° C./hr - 23° C. | end |

This particular furnace exhibited a thermal gradient of between 0 and 2° C./inch in the sample area.

After cooling, excess material was removed from the bottom of the sample.

Test Results

| Flux trap measurements - after 160 hours in oxygen | |
|---|---|
| 5000 Gauss applied | 4440 Gauss top, 3710 Gauss bottom |
| 10000 Gauss applied | 6400 Gauss top, 5000 Gauss bottom after 320 hours in oxygen |
| 10000 Gauss applied | 6600 Gauss top, 5000 Gauss bottom |

We prefer to use a specific temperature cycle and 3-dimensional thermal gradient during crystal growth. This gradient allows two phases of YBCO ($Y_2BaCuO$'s or 211 plus a liquid barium cuprate phase, $Ba_2CuO$'s) to react. This reaction is heterogeneously initiated by a seed crystal of $SmBa_2Cu_3O_{7-y}$ (123 SBCO) where $y \leq 1.6$. The crystals are typically grown from the center of a disk outward until the entire disk is one grain. Other geometries, such as a long rectangular bar, are possible. Our method of achieving our specific thermal gradient (and the parameters of this gradient) are what enable us to control the crystal growth conditions. The radial and vertical thermal gradients we use are from 1–20° C. per inch of radius on a circular specimen and from 1–20° C. per inch of thickness. Equivalent gradients are used on rectangular specimens.

We place a $SiBa_2Cu_3O_{7-y}$ (123 SBCO) single seed crystal on or within the compacted YBCO powder disk prior to heating. We make the seeds in our laboratory using a process similar to that for making the 123 YBCO single crystals. A 123 SBCO seed crystal or its equivalent initiates the epitaxial growth of the 123 YBCO crystal at the desired location and in the desired orientation. The process of growing the SBCO seed crystals for proper YBCO crystal nucleation is unique, we believe, to the process of the present invention. The seed crystals must have the purity and lattice dimensions appropriate for the heterogeneous nucleation of 123 YBCO.

A specific ratio and particle size distribution of 123 and 211 YBCO powders with the addition of a specified amount and particle size of platinum powder achieves the desired growth of 123 YBCO single crystals capable of trapping high fields.

Platinum added to the powder precursor improves yield and quality. We have been successful with several methods for processing the platinum. These processing methods include: a method for making colloidal platinum, precipitating platinum hydroxide, or reducing platinum oxide to elemental platinum. The addition of finely divided platinum to the YBCO precursor powders prevents coarsening the grain size of the 211 YBCO during the crystal growth process.

We generally use the following 17 sequential steps to fabricate large YBCO superconducting single crystals successfully:

(1) Comminute the 123 YBCO and 211 YBCO powders so that all particles are less than 37 micrometers in size, and comminute platinum so that all particles are between 0.25 and 2 micrometers in size.

(2) The individual powders are dispersed with a nonaqueous, liquid solvent, such as hexane or acetone, to form thin slurries.

(3) The three slurries are mixed. The resulting slurry has 123 YBCO powder, about 0–25 wt % dispersed 211 YBCO powder, and about 0–1 wt % dispersed platinum powder.

(4) The solvent in the combined slurry is evaporated, and the powder is further comminuted by jet miffing until the average particle size is less than 5 micrometers, as determined by particle size analysis.

(5) The powder is then uniaxially compacted into a disc or other shape using a single or double acting die and a pressure of 2,000 to 10,000 psi. We prefer a steel die.

(6) The compacted pellet is then isostatically pressed at 15,000 to 45,000 psi (and, preferably, 20,000–25,000 psi) but pressures outside this range could be used. Lower pressures would result in, so we have not tested beyond that. The compacted pellet is typically protected in an evacuated, and sealed neoprene bag prior to isostatic pressing.

(7) Either before or after isostatic pressing, the SBCO seed crystal is placed on the pellet surface in an appropriate location and with the appropriate orientation. The size of a typical seed crystal is about 1 to 2 mm in diameter. The seed crystal can also be included within the powder compact during the initial compaction stage in step 5.

(8) The pellet with the seed crystal is typically placed on the horizontal stage within a vertical tube furnace. Multiple heating zones along the length of the vertical tube aid in maintaining the desired vertical thermal gradient.

(9) The bottom of the furnace tube is closed to prevent excessive convective air flow, and the top of the furnace tube is covered with an optically transparent aperture (typically made from fused silica or sapphire). The ceramic furnace tubes used have been made from silica, alumina, or mullite.

(10) The furnace stage, on which the YBCO pellet rests, can be raised or lowered until the proper crystal growing conditions of (a) temperature at the pellet center and (b) radial thermal gradient are achieved.

(11) A radial thermal gradient within the range of 1–20° C. per inch of radius is typically used, along with vertical thermal gradient of 1–20° C. per inch of specimen.

(12) The furnace is heated to raise the temperature of the specimen at a rate of 100 to 500° C. per hour to an upper temperature of between 1010 and 1050° C. This temperature is held for 0.1 to 2 hours.

(13) The specimen temperature at the SBCO seed location is lowered at from 1–10° C. per hour. A temperature of between 1040–1000° C. is adequate for 123 YBCO crystal nucleation from the surfaces of the SBCO seed crystal.

(14) Following crystal nucleation, the specimen temperature is lowered at from 0.1 to 1° C. per hour to allow for grain growth to proceed both radially and vertically. A typical temperature range for this step is from 1039 to 950° C.

(15) Following completion of the crystal growth the furnace is cooled at a rate of 10–200° C. per hour to room temperature.

(16) After removal of the crystal from the cooled furnace, the 123 YBCO single crystals are reheated to 400–600° C. at a rate of 10–100° C. per hour in an oxygen-rich atmosphere for 10–10,000 hours for annealing. Following oxygenation, the crystals are cooled at from 5–100° C. per hour to room temperature.

(17) The final step in single crystal fabrication is to machine the single crystal, if necessary, to whatever shape and tolerances are required for the application. This step is often done prior to the oxygenation step.

The oxygenation (step 16) attempts to minimize the value of "x" in the 123 YBCO material.

While we have described preferred embodiments, those skilled in the art will readily recognize alternatives, variations, and modification which might be made without departing from the inventive concept. Therefore, interpret the claims liberally with the support of the full range of equivalents known to those of ordinary skill based upon this description. The examples illustrate the invention and are not intended to limit it. Accordingly, define the invention with the claims and limit the claims only as necessary in view of the pertinent prior art.

We claim:

1. A method of making a large single crystal that is superconducting at temperatures at or below about 77° K, comprising the steps of:
    a) mixing powders comprising from about 1–25 wt % $Y_2BaCuO_5$, [211 YBCO], from about 0.05–1 wt % platinum, and the balance $YBa_2Cu_3O_{7-x}$ [123 YBCO] where $x \leq 0.6$ so that the crystal is superconducting, the powders having an average particle size of about 5 micrometers or less;
    b) pressing the powders into a green powder compact having top and bottom surfaces,
    c) placing a seed crystal on the compact such that the seed crystal is oriented with a crystal plane of the crystal substantially parallel to the top surface of the compact;
    d) positioning the compact with the seed crystal on a bed of gravel consisting essentially of sintered $YBa_2Cu_3O_{7-x}$ and platinum;
    e) heating the compact to a temperature between about 1010–1050° C. and holding the compact at the temperature for at least about 0.1 hour;
    f) cooling the compact at a rate such that $YBa_2Cu_3O_{7-x}$ crystal growth nucleates from the seed crystal; and
    g) cooling of the nucleated compact at about 0.1–1° C. per hour to about 950° C. such that the entire compact consists essentially of a single crystal $YBa_2Cu_3O_{7-x}$ grain nucleated from the seed crystal.

2. The method of claim 1, further comprising the steps of:
    a) cooling of the nucleated compact at a rate of from about 10–200° C. per hour to room temperature;
    b) heating the compact to a temperature of from about 400–600° C.; and
    c) maintaining the heated compact in an oxygen rich atmosphere for at least about 10 hours to oxygenate the 123 YBCO.

3. The method of claim 1 wherein heating step e) and cooling step f) involve creating an axial and a radial temperature gradient in the compact.

4. A method of making a large, single crystal, $YBa_2Cu_3O_{7-x}$ crystal that has a current density of at least about $10^3$ A/cm$^2$ at 1 Tesla at or below a temperature of about 77° K, comprising the steps of:
    a) mixing powders comprising from about 1–25 wt % $Y_2BaCuO_5$, from about 0.05–1 wt % platinum, and the balance $YBa_2Cu_3O_{7-x}$, where x is less than or equal to 1.6, the powders having an average particle size of about 5 micrometers or less;
    b) pressing the powders into a green powder compact having a substantially right circular cylindrical shape,
    c) placing a single seed crystal of $SmBa_2Cu_3O_{7-y}$, where x is less than or equal to 1.6, at a location substantially on the central axis of the compact such that the seed crystal is oriented with a crystal plane substantially parallel to the axis;
    d) positioning the compact and the seed crystal on a bed of gravel consisting essentially of sintered $YBa_2Cu_3O_{7-x}$ and platinum;
    e) heating the compact to a temperature between about 1010–1050° C. and holding the compact at that temperature for at least about 0.1 hour;
    f) creating an increasing radial temperature gradient of from about 1–20° C. per inch radially outward from a central axis of the compact;
    g) while maintaining the gradient, cooling the compact at a rate of from about 1–10° C. per hour such that $YBa_2Cu_3O_{7-x}$ crystal growth nucleates from the $SmBa_2Cu_3O_{7-x}$ seed crystal;
h) cooling the nucleated compact at about 0.1–1° C. per hour to about 950° C. such that the entire compact consists essentially of a single $YBa_2Cu_3O_{7-x}$ grain nucleated from the seed crystal;
i) cooling the compact, thereafter, at about 10–200° C. per hour to room temperature;
j) reheating the compact to a temperature of about 400–600° C.; and
k) maintaining the heated compact in an oxygen rich atmosphere for at least about 10 hours, to reoxygenate the single grain.

5. A method of making a large, single crystal, $YBa_2Cu_3O_{7-x}$ crystal, where $x \leq 0.6$, that has a current density of at least about $10^3$ A/cm$^2$ at 1 Tesla at or below a temperature of about 77° K, comprising the steps of:
   a) mixing powders comprising from about 1–25 wt % $Y_2BaCuO_5$, from about 0.05–1.0 wt % platinum, and the balance $YBa_2Cu_3O_{7-x}$, the powders having an average particle size of about 5 micrometers or less;
   b) pressing the powders into a green powder compact having substantially a right circular cylindrical shape;
   c) placing a seed crystal of $SmBa_2Cu_3O_{7-y}$, where y is less than or equal to 1.6, at a location substantially on the central axis on the top circular surface of the substantially cylindrical compact such that the seed crystal is oriented with a crystal plane thereof substantially parallel to the axis;
   d) positioning the compact and the seed crystal on a bed of gravel consisting essentially of sintered $YBa_2Cu_3O_{7-x}$ and Platinum;
   e) heating the compact to a temperature between about 1010–1050° C. and holding the compact at the temperature for at least about 0.1 hour;
   f) creating an increasing radial temperature gradient of from about 1–20° C. per inch radially outward from the central axis of the cylinder;
   g) creating an increasing axial temperature gradient of from about 1–20° C. per inch downward from the top surface of the cylinder;
   h) while maintaining the radial and axial temperature gradients, cooling the compact at a rate of from about 1–10° C. per hour such that $YBa_2Cu_3O_{7-x}$ crystal growth nucleates from the seed crystal;
   i) thereafter, cooling the compact at a rate of from about 0.1–1° C. per hour to a temperature of about 950° C. such that the entire compact consists essentially of a single $YBa_2Cu_3O_{7-x}$ grain nucleated from the seed crystal;
   j) thereafter, further cooling the compact at a rate of from about 10–200° C. per hour to room temperature;
   k) heating the room temperature compact to a temperature of from about 400–600° C.; and
   l) maintaining the heated compact in an oxygen rich atmosphere for at least about 10 hours to oxygenate the 123 YBCO.

6. A method for making a large, single crystal 123 YBCO superconductor, comprising the steps of:
   (a) creating axial and radial temperature gradients in a compact of 123 YBCO precursor powders and an effective amount of Pt, the radial gradient being about 1–20° C./inch outward from a center of the compact to control crystal growth;
   (b) cooling the compact while maintaining the temperature gradients, the rate of cooling being sufficient to nucleate single crystal growth in the compact; and
   (c) reoxygenating the single crystal by heating the single crystal in an oxygen-rich atmosphere.

7. The method of claim 6 further comprising the step of: seeding crystal growth in the compact with a samarium oxide seed crystal.

8. A method for making large, single crystal 123 YBCO materials, comprising the steps of:
   (a) compacting powders of 123 YBCO, 211 YBCO, and Pt;
   (b) nucleating crystal growth by heating the compacted powders in the presence of a samarium oxide seed crystal;
   (c) cooling the nucleated compact to promote development of a single crystal; and
   (d) reoxygenating the single crystal by heating the single crystal in an oxygen-rich atmosphere.

9. The method of claim 8 wherein cooling occurs at about 0.1–1.0° C./hour.

10. The method of claim 9 further comprising the steps of:
    (a) creating a radial temperature gradient in the compact; and
    (b) creating an axial temperature gradient in the compact, wherein nucleating involves maintaining the radial and axial temperature gradients while cooling the compact after achieving a temperature between about 1010°–1050° C.

* * * * *